US012609679B2

(12) United States Patent
Bugade et al.

(10) Patent No.: US 12,609,679 B2
(45) Date of Patent: Apr. 21, 2026

(54) QUADRATURE PHASE SHIFTED CLOCK GENERATION WITH DUTY CYCLE CORRECTION

(71) Applicant: NXP B.V., Eindhoven (NL)

(72) Inventors: Vishwajit Babasaheb Bugade, Kolhapur (IN); Anand Kumar Sinha, Noida (IN); Krishna Thakur, GautamBudh Nagar (IN); Siyaram Sahu, Bari Raisen (IN)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 18/771,327

(22) Filed: Jul. 12, 2024

(65) Prior Publication Data

US 2025/0055446 A1 Feb. 13, 2025

(30) Foreign Application Priority Data

Aug. 9, 2023 (IN) .............................. 202311053451

(51) Int. Cl.
| | |
|---|---|
| H03K 3/017 | (2006.01) |
| G06F 1/08 | (2006.01) |
| H03K 5/01 | (2006.01) |
| *H03K 5/00* | (2006.01) |

(52) U.S. Cl.
CPC .............. H03K 3/017 (2013.01); G06F 1/08 (2013.01); H03K 5/01 (2013.01); *H03K 2005/00013* (2013.01); *H03K 2005/00286* (2013.01)

(58) Field of Classification Search
CPC .................... H03K 3/017; H03K 5/01; H03K 2005/00013; H03K 2005/00286; H03K 5/1565; H03K 5/135; H03K 5/14; G06F 1/08

USPC ......................................................... 327/175
See application file for complete search history.

(56) References Cited

U.S. PATENT DOCUMENTS

| | | | |
|---|---|---|---|
| 5,399,995 | A | 3/1995 | Kardontchik et al. |
| 5,687,202 | A | 11/1997 | Eitrheim |
| 5,923,621 | A | 7/1999 | Kanekal et al. |
| 6,285,226 | B1 | 9/2001 | Nguyen |

(Continued)

FOREIGN PATENT DOCUMENTS

WO 2021092601 A2 5/2021

OTHER PUBLICATIONS

Amber Han-Yuan Tan et al: "Phase Mismatch Detection and Compensation for PLL/DLL Based Multi-Phase Clock Generator", Conference 2006, IEEE Custom Integrated Circuits, IEEE, Piscataway, NJ, USA, Sep. 1, 2006, pp. 417-420.

*Primary Examiner* — Ryan Jager

(57) ABSTRACT

A method for quadrature phase shifted clock generation with duty cycle correction includes A reference clock is delayed with a delay circuit to generate a delayed clock, wherein a delay of the delay circuit is proportional to a control value, and each of the reference clock and the delayed clock comprise a plurality of states comprising a first state and a second state. A first edge value is increased or decreased in response to a respective combination of states of the reference clock and the delayed clock. A second edge value is increased or decreased in response to a respective combination of states of the reference clock and the delayed clock. The control value is driven to the first edge value during the second state of the delayed clock and to the second edge value during the first state of the delayed clock.

22 Claims, 11 Drawing Sheets

(56) References Cited

U.S. PATENT DOCUMENTS

| | | | | |
|---|---|---|---|---|
| 6,348,821 | B1 * | 2/2002 | Schwartz | ............. H03K 5/1565 |
| | | | | 327/119 |
| 6,535,024 | B1 | 3/2003 | Rochard | |
| 6,690,223 | B1 | 2/2004 | Wan | |
| 6,967,508 | B2 * | 11/2005 | Zhou | .................. H03K 5/00006 |
| | | | | 327/116 |
| 7,332,947 | B2 | 2/2008 | Kumar et al. | |
| 7,683,683 | B1 * | 3/2010 | Majumder | .............. H03L 7/085 |
| | | | | 327/175 |
| 7,724,100 | B2 | 5/2010 | Gong et al. | |
| 8,248,130 | B2 | 8/2012 | Jain et al. | |
| 8,253,466 | B2 | 8/2012 | Jeffries et al. | |
| 9,124,250 | B2 * | 9/2015 | Hinrichs | ................. H03L 7/089 |
| 2003/0179842 | A1 * | 9/2003 | Kane | .................... H03L 7/0805 |
| | | | | 375/376 |
| 2004/0232955 | A1 * | 11/2004 | Chin-Chieh | ......... H03K 5/1565 |
| | | | | 327/119 |
| 2017/0230052 | A1 * | 8/2017 | Jeong | ...................... H03L 7/091 |
| 2024/0192720 | A1 | 6/2024 | Bugade et al. | |
| 2025/0055446 | A1 * | 2/2025 | Bugade | ................... H03K 5/01 |

* cited by examiner tg_gate 196 = clk_dly_b 92
tg_gate_b 197 = clk_dly 36
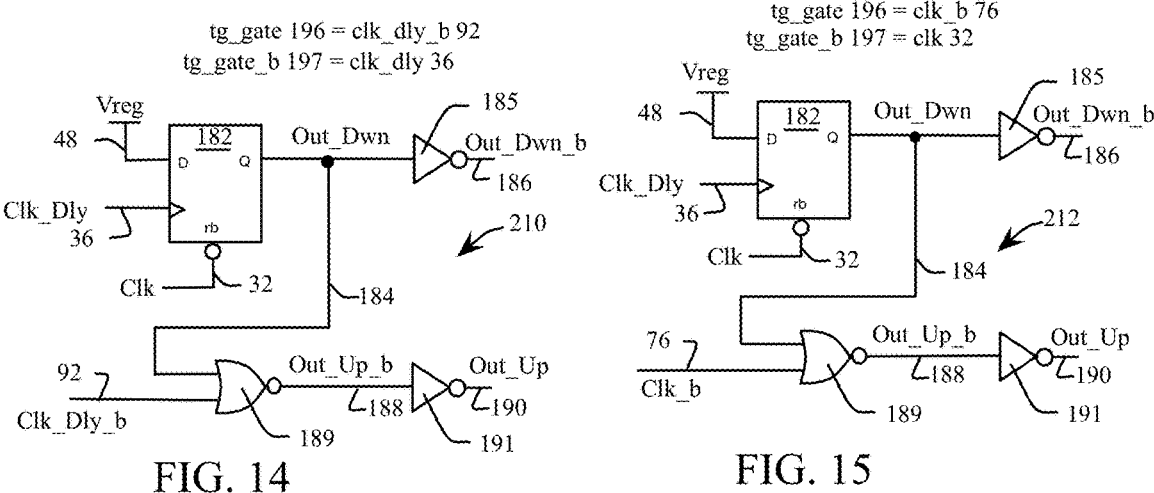
FIG. 14
tg_gate 196 = clk_b 76
tg_gate_b 197 = clk 32
FIG. 15
tg_gate 196 = clk_dly 36
tg_gate_b 197 = clk_dly_b 92
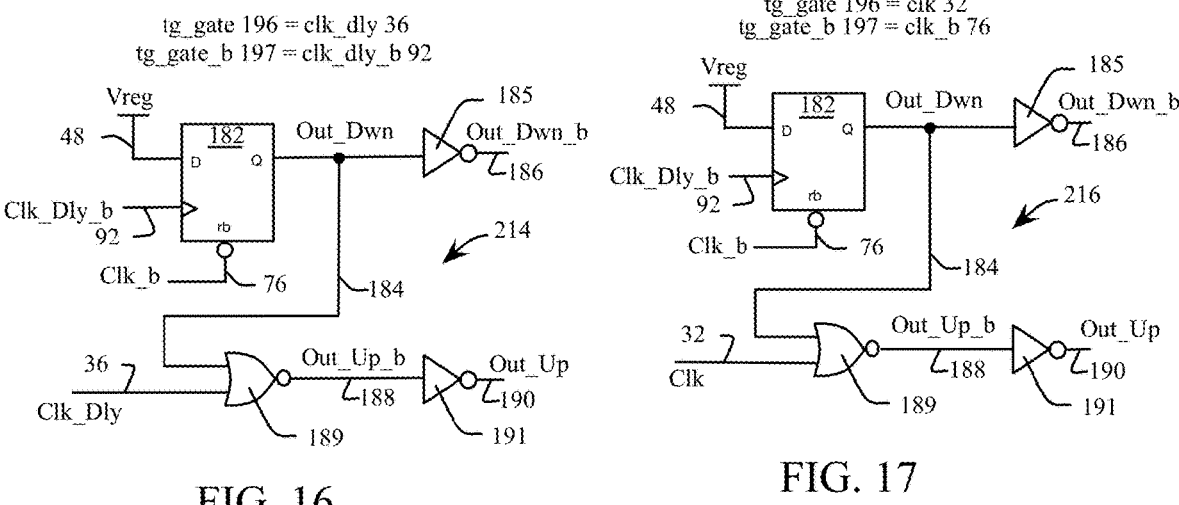
FIG. 16
tg_gate 196 = clk 32
tg_gate_b 197 = clk_b 76
FIG. 17

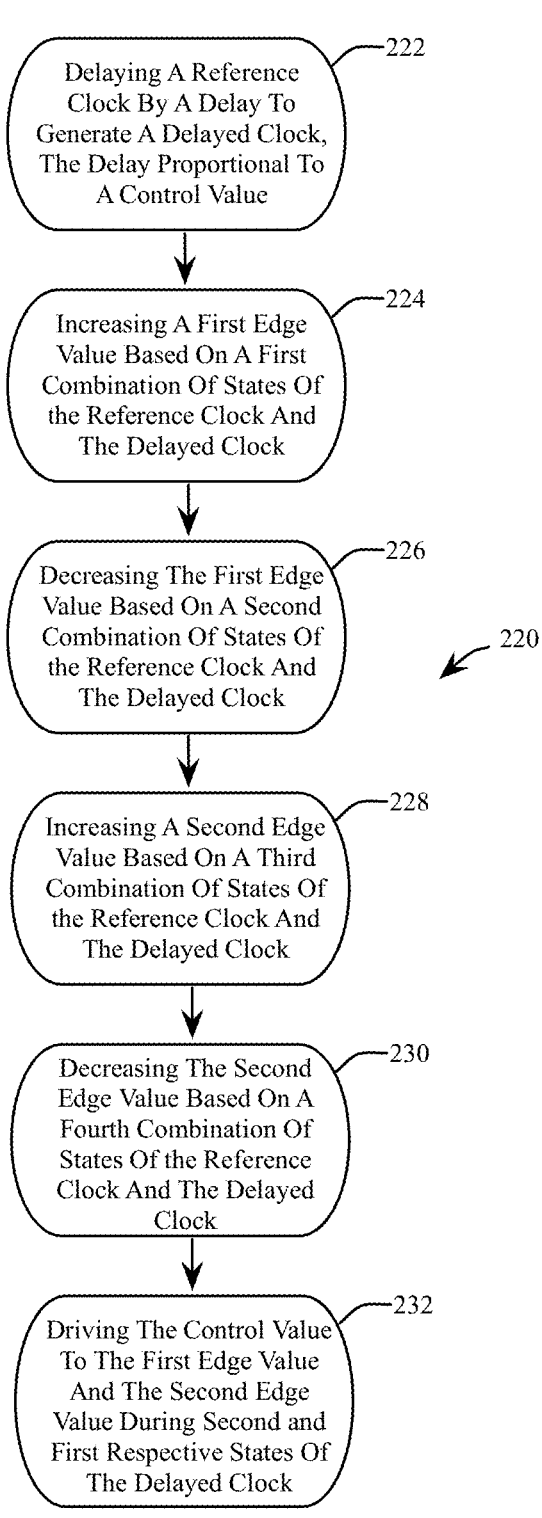

Delaying A Reference Clock By A Delay To Generate A Delayed Clock, The Delay Proportional To A Control Value —222

Increasing A First Edge Value Based On A First Combination Of States Of the Reference Clock And The Delayed Clock —224

Decreasing The First Edge Value Based On A Second Combination Of States Of the Reference Clock And The Delayed Clock —226

220

Increasing A Second Edge Value Based On A Third Combination Of States Of the Reference Clock And The Delayed Clock —228

Decreasing The Second Edge Value Based On A Fourth Combination Of States Of the Reference Clock And The Delayed Clock —230

Driving The Control Value To The First Edge Value And The Second Edge Value During Second and First Respective States Of The Delayed Clock —232

FIG. 18

QUADRATURE PHASE SHIFTED CLOCK GENERATION WITH DUTY CYCLE CORRECTION

CROSS-REFERENCE TO RELATED APPLICATIONS

This application claims the priority under 35 U.S.C. § 119 of India application No. 202311053451, filed on 9 Aug. 2023, the contents of which are incorporated by reference herein.

FIELD

This disclosure relates generally to electronic circuits, and more specifically to the generation of a quadrature phase shifted clock from a reference clock having an arbitrary input duty cycle.

BACKGROUND

In switched crystal oscillator circuits, timing the charging and discharging of crystal nodes at exactly their maxima and minima is important for efficient operation and to minimize power consumption. Accordingly, it is advantageous to delay both edges of a delayed clock to be properly centered with respect to a respective high or low phase of a reference clock, from which the delayed clock is derived. Furthermore, the timing of the edges of the delayed clock should not be sensitive to changes in the duty cycle of the reference clock.

Many high-speed circuits and logic families use double data rate technology, where both rising and falling edges of the delayed clock may be used to trigger different events. In addition, with respect to the use of high frequency clocks, symmetry between high time and low time is desired to minimize constraints on set-up & hold timings, arising from non-ideal input duty cycle and to allow proper functioning at higher frequencies.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 14 to FIG. 17 are schematic views of alternative embodiments modifying the embodiment of FIG. 12, in accordance with an embodiment of the present disclosure.

FIG. 18 is a flowchart representation of a method for quadrature phase shifted clock generation with duty cycle correction, in accordance with an embodiment of the present disclosure.

DETAILED DESCRIPTION

Embodiments described herein provide for the centering and alignment of one or both edges of a delayed clock relative to a reference clock used to derive the delayed clock. Edge alignment is achieved over an entire input duty range of the reference clock by using a feedback loop that adjusts the edge by determining a control value. The control value may be determined from a combination of charging and discharging a capacitor, by integrating an inductive current or by other methods used to determine a measure of elapsed time between the edge of the delayed clock and the beginning and end of a high state or low state of the reference clock, from which the delayed clock is derived. By further determining a difference between the elapsed time and the edges of the reference clock, a rising edge of the delayed clock may be adjusted to be centered between logic high state of reference clock (or similarly for the corresponding fall edges of the delayed and reference clocks). Centering of the edges may be achieved within limits of environmental and manufacturing tolerances of an apparatus used to achieve the same.

Figure 1:
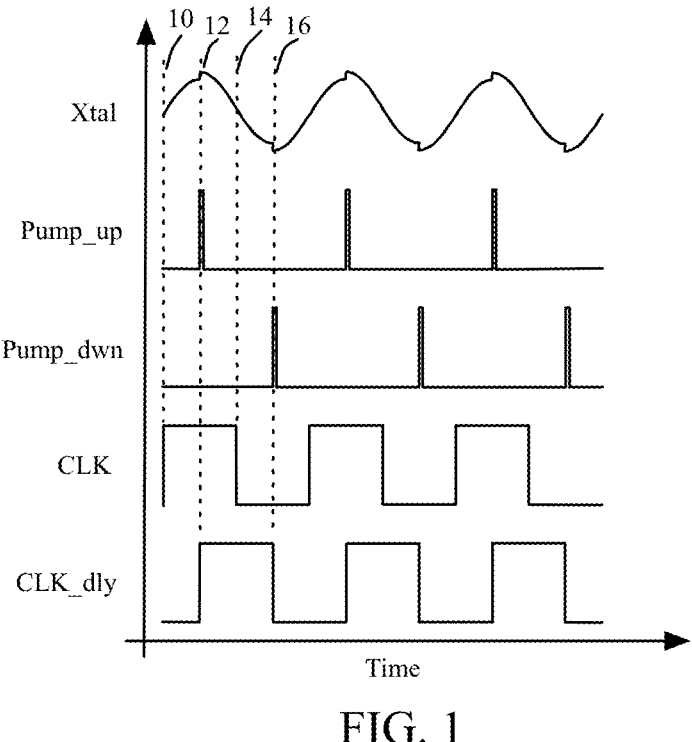
FIG. 1 is a graphical view of generated timing signals from an embodiment of clock delay circuit having an input reference clock with a 50% input duty cycle.

FIG. 1 shows the timing of signals used to control a crystal oscillator ("Xtal") in switched oscillator topology from a reference clock having a 50% input duty cycle. At 10, a rising edge of a reference clock ("CLK") is delayed to produce a rising edge of a delayed clock ("CLK_dly") at 12. Similarly, at 14, a falling edge of the clock is delayed to produce a falling edge of the delayed clock at 16. The rising and falling edges of the delayed clock may be used to generate short timing signals "Pump_up" and "Pump_dwn" at the crests and troughs of the crystal oscillator.

Figure 2:
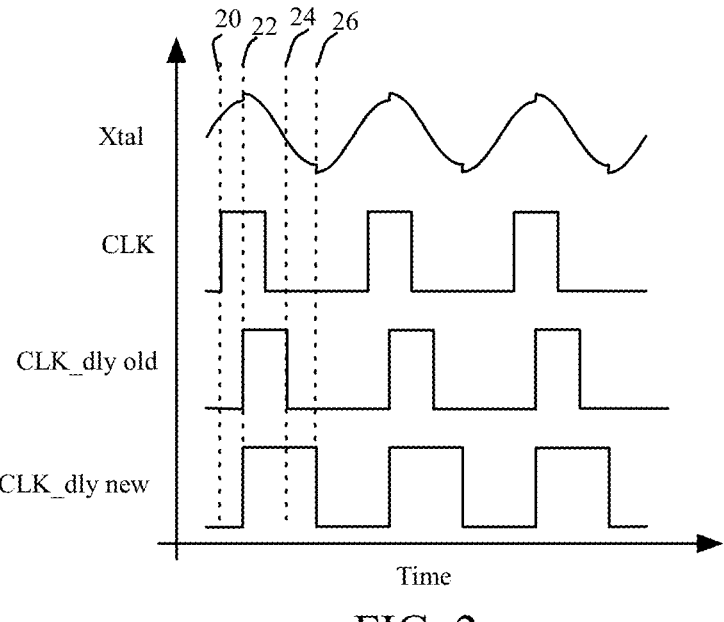
FIG. 2 is a graphical view of generated timing signals from an embodiment of clock delay circuit having an input reference clock with a 30% input duty cycle.

In contrast to FIG. 1, FIG. 2 shows the timing of signals used to control a switched crystal oscillator when the reference clock has a 30% input duty cycle. At 20, a rising edge of the reference clock ("CLK") may be used to generate a delayed clock (CLK_dly old or CLK_dly new) with a rising edge at 22, properly centered within a high state of the reference clock. The delayed clock shown by "CLK_dly old" has a falling edge at 24, in contrast to the delayed clock shown by "CLK_dly new" which has a falling edge at 26. The falling edge at 24 is not properly centered at a trough of the crystal oscillator, unlike the properly aligned edge at 26, which is centered at the trough and the low state of the reference clock "CLK". Accordingly, there are advantages for crystal oscillator control as well as DDR applications and other non-limiting applications, to generating a delayed clock with both rising and falling edges properly centered within corresponding high and low states of the reference clock, from which the delayed clock is derived.

Figure 3:
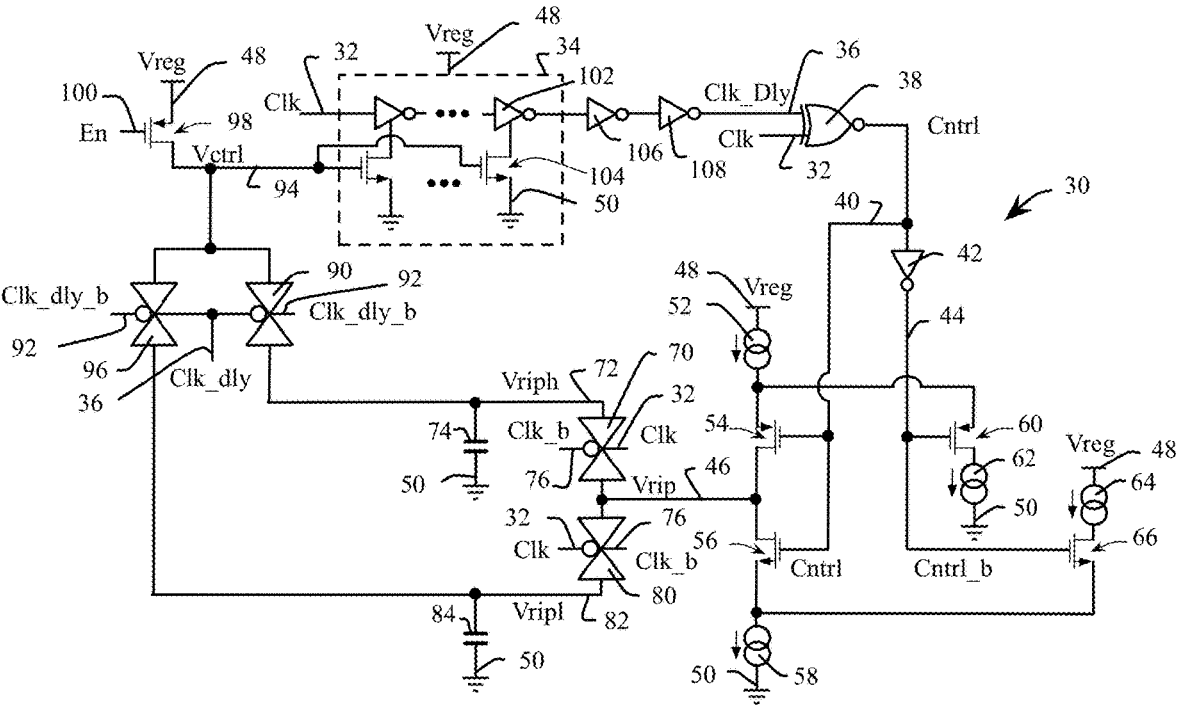
FIG. 3 is a schematic view of a quadrature phase shifted clock generation circuit with duty cycle correction, in accordance with an embodiment of the present disclosure.

FIG. 3 shows an embodiment 30 of a quadrature phase shifted clock generation circuit with duty cycle correction, in accordance with the present disclosure. A reference clock 32 is delayed by a delay circuit 34 to generate a delayed clock 36. An Exclusive-NOR (XNOR) logical gate 38 generates a control "Cntrl" signal 40 from the reference clock 32 and the delayed clock 36. The "Cntrl" signal 40 is inverted by an inverter 42 to generate a "Cntrl_b" signal 44.

A charging and discharging circuit is configured to modify a ripple voltage 46 and is formed between a supply voltage 48 and ground 50. A current source 52 in series with a P-channel Field Effect Transistor (PFET) will increase the ripple voltage 46 when Cntrl 40 is in a high state. Conversely, an N-channel Field Effect Transistor (NFET) 56 in series with a current source 58 will discharge the ripple voltage 46 when Cntrl 40 is in a low state.

A second branch is formed with a PFET 60 between the current source 52 and a current source 62 and an NFET 66 between a current source 64 and the current source 58. The purpose of this second branch is to divert current from the current source 52 to the current source (e.g. sink) 62 when the ripple voltage 46 is not being charged through the PFET 54. Conversely, the second branch also diverts current from the current source 64 to the current source (e.g. sink) 58 when the ripple voltage 46 is not being discharged through the NFET 56. The embodiment 30 may operate in an ultra-low current application where control of parasitic effects is important. An implementation based on current mirroring devices would require large transistor device sizes with correspondingly large parasitic effects. Thus, to reduce non-ideality arising from the larger parasitic effects of mirrored current devices, alternate current paths are provided rather than switching off the current sources 52 and 58.

The ripple voltage 46 may be increased or decreased (e.g., charged or discharged) based on a first, second, third or fourth combination of the states (e.g. high or low) of the reference clock 32 and the delayed clock 36. In one embodiment, the first combination (reference clock 32 high and delayed clock 36 low), and the third combination (reference clock 32 low and delayed clock 36 high) will be decoded by the XNOR gate 38 to drive the Cntrl signal 40 low, thereby activating the PFET 54 to charge the ripple voltage 46 from the current source 52. Conversely, the second combination (reference clock 32 high and delayed clock 36 high) and the fourth combination (reference clock 32 low and delayed clock 36 low) will result in the Cntrl signal 40 driven high and the ripple voltage 46 discharging through the NFET 56 and the current source 58.

In one embodiment, the charging and discharging of the ripple voltage 46 during the high state of the reference clock 32 is used to adjust and center a rising edge of the delayed clock 36 within the high state of the reference clock 32. Accordingly, during the high state of the reference clock 32, the ripple voltage 46 is allowed to pass through a transmission gate 70 to a node Vriph 72 and may be stored on a capacitor 74. The transmission gate is enabled to allow coupling of the ripple voltage 46 to the node 72 with the reference clock 32 and an inverted reference clock ("Clk_"b) 76. Similarly, the charging and discharging of the ripple voltage 46 during the low state of the reference clock 32 is used to adjust and center a falling edge of the delayed clock 36 within the low state of the reference clock 32. Accordingly, during the low state of the reference clock 32, the ripple voltage 46 is allowed to pass through a transmission gate 80 to a node Vripl 82 and may be stored on a capacitor 84. The transmission gate is enabled to allow coupling of the ripple voltage 46 to the node 82 with the reference clock 32 and the inverted reference clock ("Clk_"b) 76. In some embodiments, the value of the ripple voltage 46 subsequently stored on the respective capacitors 74 and 84 (e.g., Vriph 72 and Vripl 82), may be referred to as a respective edge value.

The ripple voltage on the nodes Vriph 72 and Vripl 82 are alternately multiplexed and coupled to the control voltage 94 with transmission gates 90 and 96. Specifically, the control voltage 94 is driven (by coupling) to the ripple voltage on the Vriph node 72 when the delayed clock 36 is low (e.g. Clk_dly 36 is high and Clk_dly_b 92 is low). The control voltage 94 is driven (by coupling) to the ripple voltage on the Vripl node 82 when the delayed clock 36 is high. In so doing, the falling edge of the reference clock 32 is delayed by the delay circuit 34 with a fully integrated (charged) ripple voltage 46 before generating the falling edge of the delayed clock 36. Similarly, the rising edge of the reference clock 32 is delayed by the delay circuit 34 with a fully integrated (charged) ripple voltage 46 before generating the rising edge of the delayed clock 36.

In one embodiment, the delay circuit 34 is initialized to provide a zero-time delay using a PFET 98 controlled by an Enable ("En") signal 100. The delay circuit 34 may comprise a cascaded plurality of inverters 102, whose bias current (e.g., IDS) may be sourced by a respective NFET 104 connected to ground 50. For example, increasing the control voltage 94 will result in more current sunk from the NFET 104 to ground 50, thereby increasing the transconductance of the transistors comprising each inverter 102 and reducing the transit delay therethrough. In one embodiment, the output of the delay circuit 34 may be further buffered by inverters 106 and 108 to generate the delayed clock 36.

Figure 4:
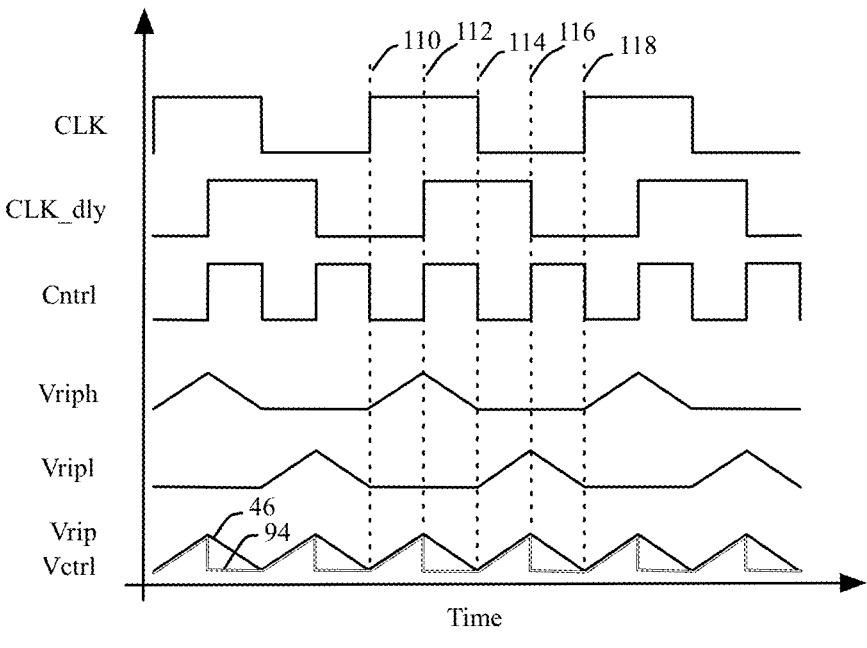
FIG. 4 is a graphical view of generated timing signals from the embodiment of FIG. 3 using an input reference clock with a 50% input duty cycle.

FIG. 4 shows the generated timing signals of the embodiment 30 of FIG. 3 with a 50% input duty cycle of the reference clock 32. Specifically, the first combination of the states of the reference clock 32 and the delayed clock 36 is defined between a rising edge 110 of the reference clock 32 and a rising edge 112 of the delayed clock 36. The second combination of the states of the reference clock 32 and the delayed clock 36 is defined between the rising edge 112 of the delayed clock 36 and a falling edge 114 of the reference clock 32. The third combination of the states of the reference clock 32 and the delayed clock 36 is defined between the falling edge 114 of the reference clock 32 and a falling edge 116 of the delayed clock 36. The fourth combination of the states of the reference clock 32 and the delayed clock 36 is defined between the falling edge 116 of the delayed clock 36 and a rising edge 118 of the reference clock 32. As discussed with the reference to FIG. 3, the ripple voltage 46 includes both a voltage increase and decrease (e.g. charging and discharging) to center both the rising and falling edges of the delayed clock 36. The voltage control 94 is multiplexed between the voltages on the Vriph node 72 and the Vripl node 82 using the delayed clock 36 and the inverted delayed clock 92. For ease of illustration, coincident traces for the ripple voltage 46 and the control voltage 94 are offset in FIG. 4 and subsequent similar figures so that the behavior of these voltages may be more clearly visualized and understood.

Figure 5:
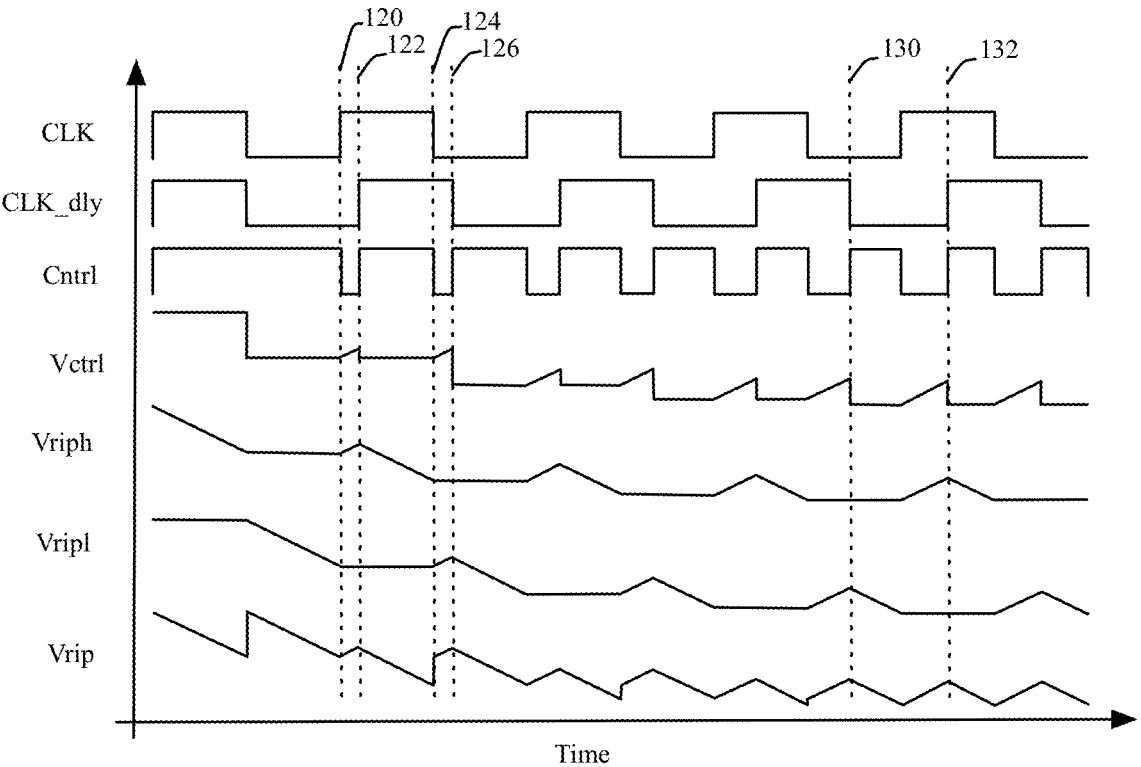
FIG. 5 is a graphical view of generated timing signals during initialization of the embodiment of FIG. 3 using an input reference clock with a 50% input duty cycle.
Figure 6:
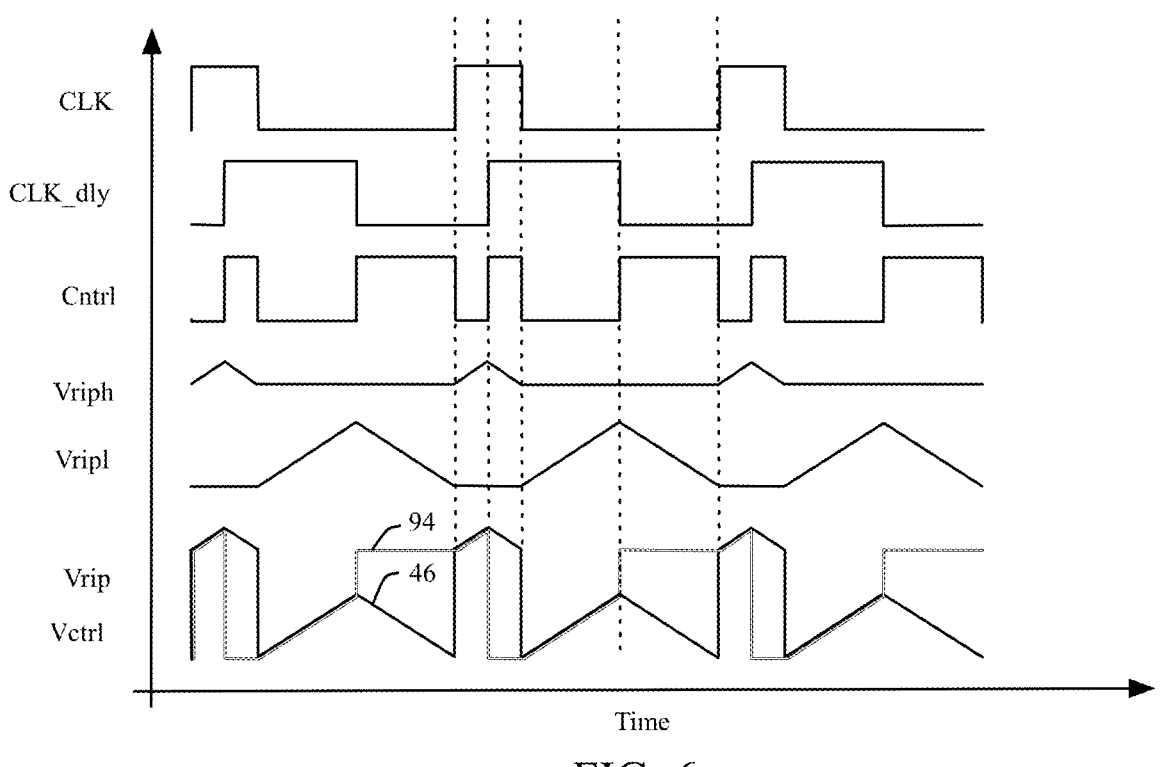
FIG. 6 is a graphical view of generated timing signals from the embodiment of FIG. 3 using an input reference clock with a 25% input duty cycle.
Figure 7:
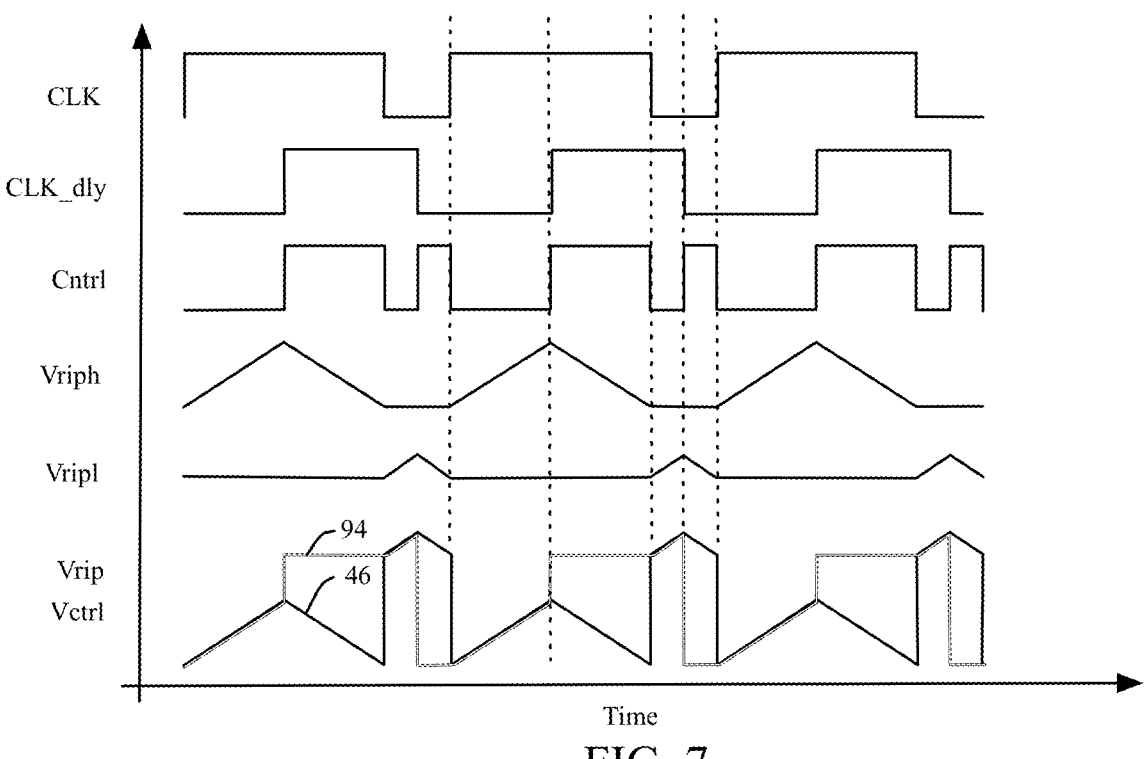
FIG. 7 is a graphical view of generated timing signals from the embodiment of FIG. 3 using an input reference clock with a 75% input duty cycle.

FIG. 5 with continued reference to FIG. 3 shows the generated timing signals during the initialization of embodiment 30 of FIG. 3 with a 50% input duty cycle of the reference clock 32. As shown in FIG. 5, the rising edge 120 of the reference clock 32 generates a corresponding rising edge 122 of the delayed clock 36, which initially is poorly centered within the high state of the reference clock 32. Similarly, the falling edge 124 of the reference clock 32 generates a corresponding rising edge 126 of the delayed clock 36, which initially is poorly centered within the low state of the reference clock 32. After several cycles, the closed loop system of FIG. 3 converges with both centered falling edge 130 and centered rising edge 132 of the delayed clock 36. Similarly, FIG. 6 and FIG. 7 show the convergence of aligning rising and falling edges of the delayed clock 36 for a reference clock 32 having an input duty cycle of 25% and 75% respectively.

Figure 8:
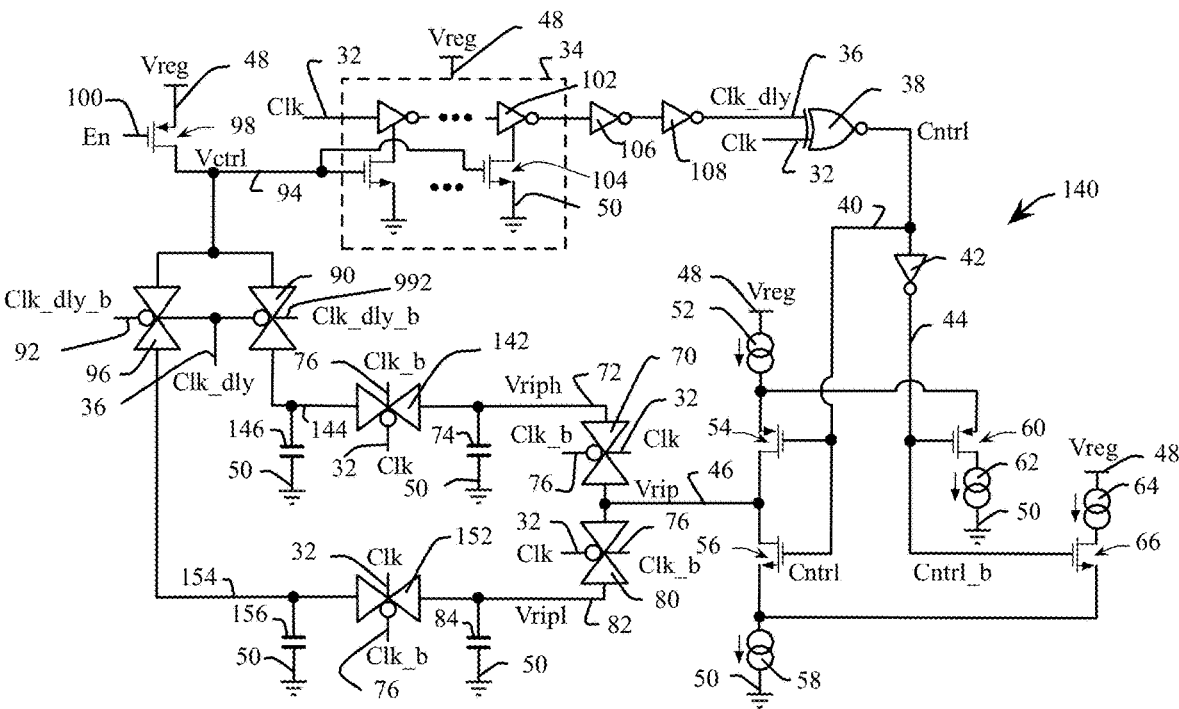
FIG. 8 is a schematic view of a quadrature phase shifted clock generation circuit with ripple masking, in accordance with an embodiment of the present disclosure.
Figure 9:
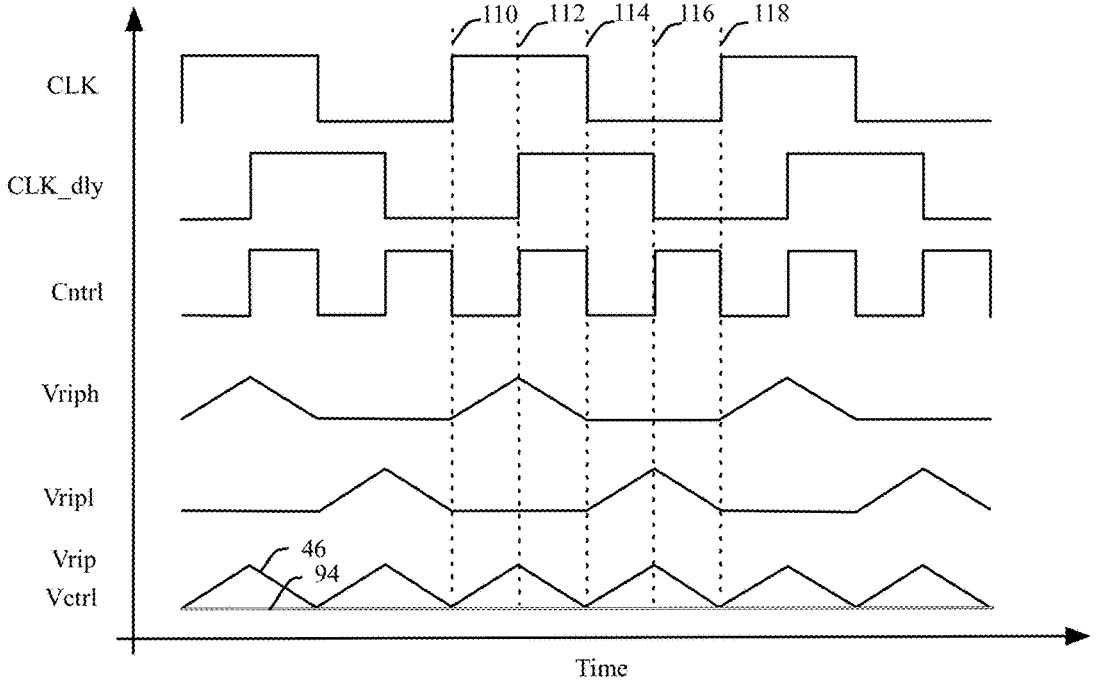
FIG. 9 is a graphical view of generated timing signals from the embodiment of FIG. 8 using an input reference clock with a 50% input duty cycle.

FIG. 8 shows an embodiment 140 of a quadrature phase shifted clock generation circuit with duty cycle correction and ripple masking, in accordance with the present disclosure. FIG. 9 shows the generated timing signals from the embodiment 140 of FIG. 8. With reference to FIG. 8, FIG. 9 and in contrast to FIG. 3 and FIG. 4, a ripple mask is formed in the embodiment 140 in the negative feedback loop. Specifically, the transfer of the ripple voltage 46 to the multiplexer formed by transmission gates 90 and 96 is buffered in two stages so that more stability is provided to delay circuit 34 controlled by the control voltage 94. Specifically, the ripple voltage 46 is transferred to the Vriph node 72 during a high state of the reference clock 32, then through a transmission gate 142 to a node 144 having a storage capacitor 146 during a low state of the reference clock 32. Similarly, the ripple voltage 46 is transferred to the Vripl node 82 during a low state of the reference clock 32, then through a transmission gate 152 to a node 154 having a storage capacitor 156 during a high state of the reference clock 32. While the closed loop system of embodiment 140 may ensure proper edge centering, variation in the control voltage 94 are preferably masked to ensure predictable delays from the rising edge 110 of the reference clock 32 to the rising edge 112 of the delayed clock 36 and from the falling edge 114 of the reference clock 32 to the falling edge 116 of the delayed clock 36.

Figure 10:
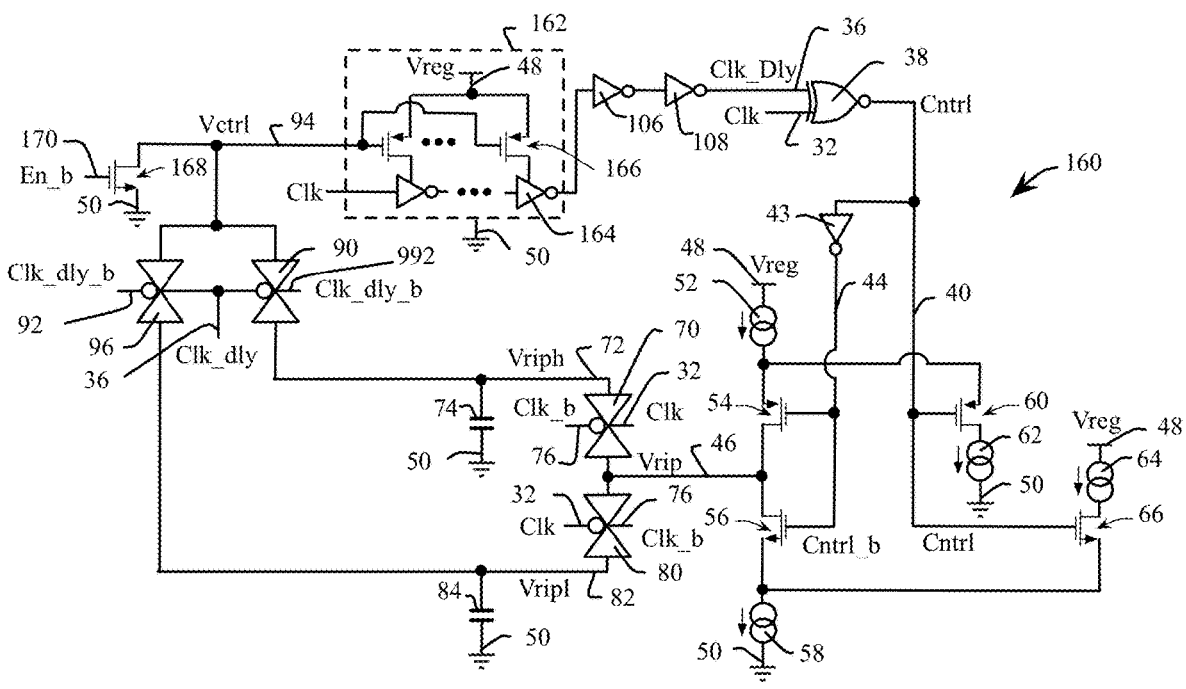
FIG. 10 is a schematic view of the quadrature phase shifted clock generation circuit of FIG. 3 with a modified delay line, in accordance with an embodiment of the present disclosure.
Figure 11:
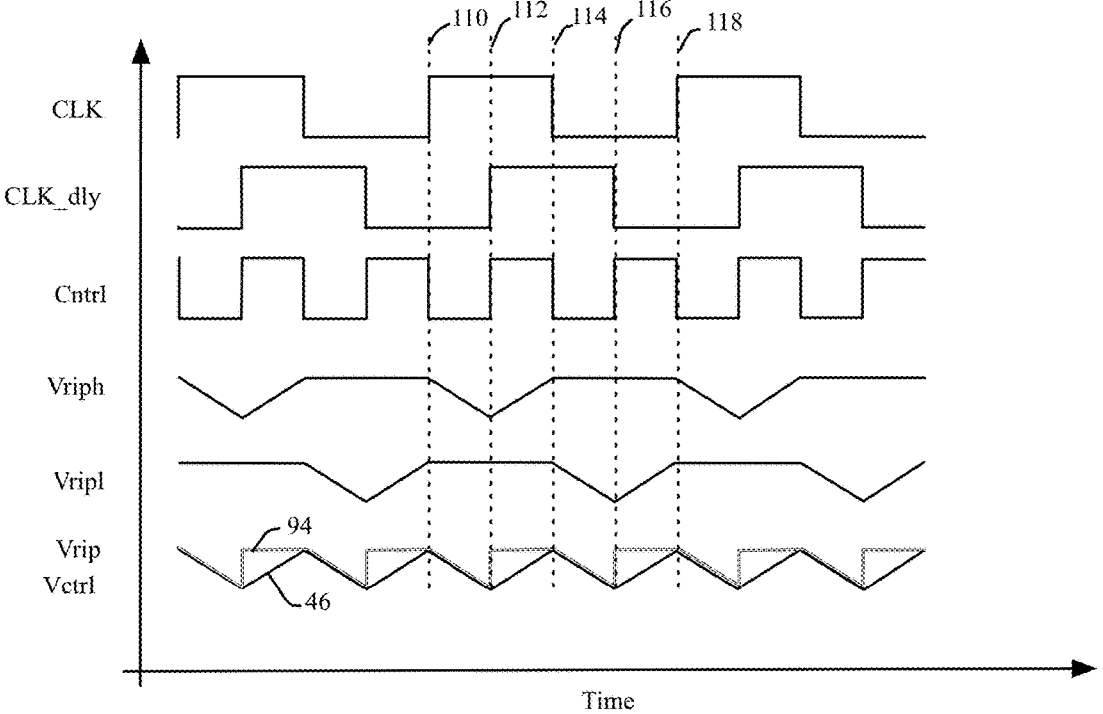
FIG. 11 is a graphical view of generated timing signals from the embodiment of FIG. 10 using an input reference clock with a 50% input duty cycle.

FIG. 10 shows an embodiment 160 of a quadrature phase shifted clock generation circuit with duty cycle correction with a PFET based delay control, in accordance with the present disclosure. FIG. 11 shows the corresponding generation of timing signals for the embodiment 160 of FIG. 10.

With reference to FIG. 10, FIG. 11 and in contrast to FIG. 3 and FIG. 4, a delay circuit 162 is formed with a cascaded plurality of inverters 164 whose bias current (e.g., IDS) may be provided by a respective PFET 166 connect to the voltage source 48. For example, decreasing the control voltage 94 will result in more current sourced from the PFET 166 from the supply 48, thereby increasing the transconductance of the transistors comprising each inverter 164 and reducing the transit delay therethrough. The function of the Cntrl signal 40 is also modified by generating an inverted signal Cntrl_b 44 with an inverter 43. The inverted signal Cntrl_b 44 now drives the gates of the PFET 54 and NFET 56 respectively. In one embodiment, the delay circuit 162 is initialized to provide a zero-time delay using an NFET 168 controlled by an inverted Enable ("En_b") signal 170.

Figures 12, 13:
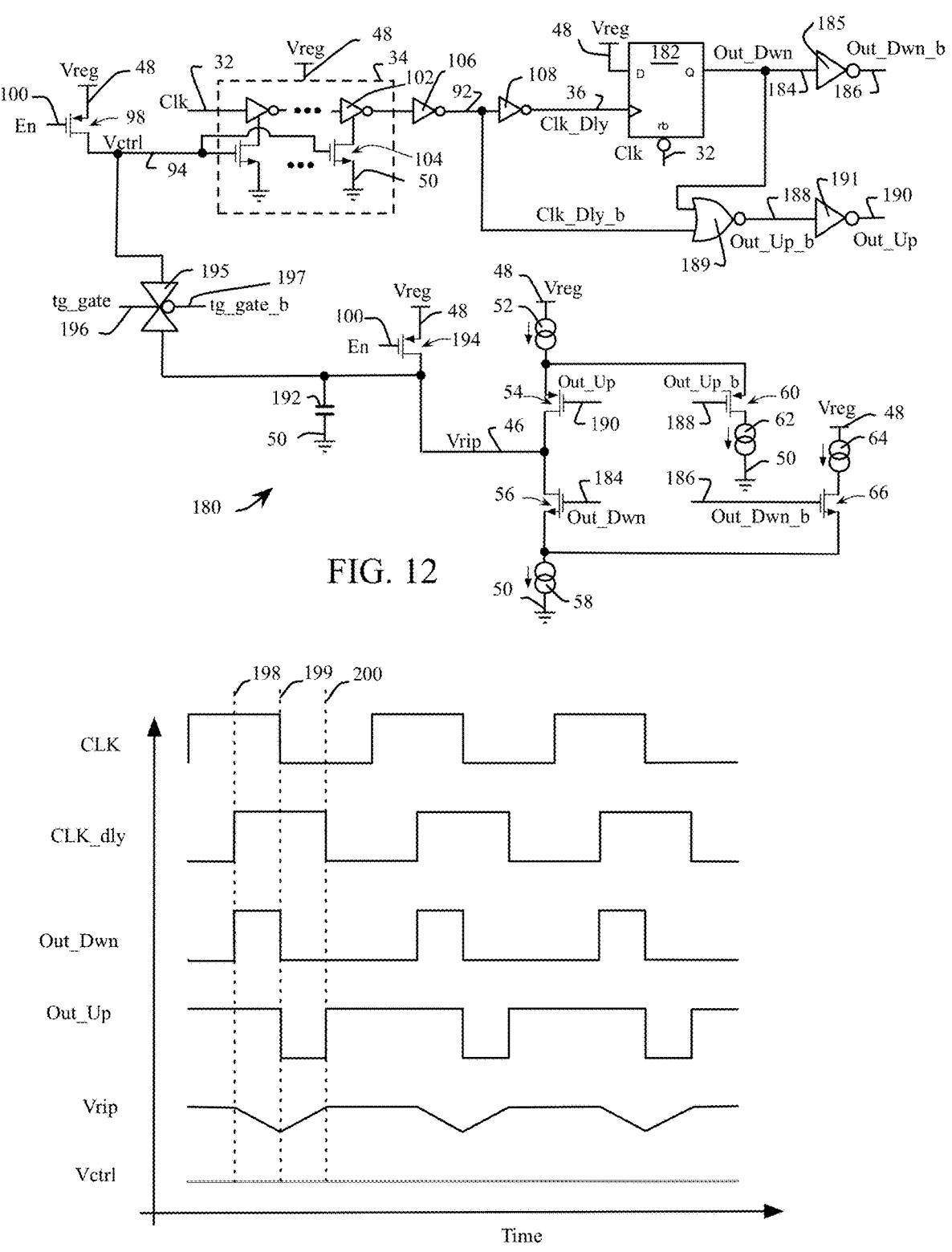
FIG. 12 is a schematic view of a quadrature phase shifted clock generation circuit modified to control only one edge of the delayed clock, in accordance with an embodiment of the present disclosure.
FIG. 13 is a graphical view of generated timing signals from the embodiment of FIG. 12 using an input reference clock with a 50% input duty cycle.

FIG. 12 shows an embodiment 180 of a quadrature phase shifted clock generation circuit modified to control the rising edge of the delayed clock without changing duty cycle, in accordance with an embodiment of the present disclosure. The embodiment 180 is simplified over previously described embodiments at the expense of controlling only one edge of the delayed clock 36, while still being able to operate over a full input duty cycle range of the reference clock 32. FIG. 13 shows the generated timing signals from the embodiment 180 of FIG. 12. Referring to FIG. 12 and FIG. 13, a bistable device (e.g. a "flip-flop") 182 captures various combinations of the reference clock 32 and the delayed clock 36 to generate a discharge signal ("Out_Dwn") 184, an inverted discharge signal ("Out_Dwn_b") 186 from inverter 185, an inverted charging signal ("Out_Up_b") 188 from a NOR gate 189 and a charging signal ("Out_Up") 190 from an inverter 191. In addition, in one embodiment the ripple voltage 46 may be stored on a capacitor 192 and initialized with a PFET 194 controlled by the enable signal ("En") 100.

In steady state, when both the reference clock 32 and the delayed clock 36 are in a high state, the discharge signal ("Out_Dwn") 184 is in a high state and the ripple voltage 46 discharges with a constant current set by the current source 58. When the reference clock 32 transitions low (at 199), the flip-flop 182 is reset and the Out_Dwn signal 184 transitions low. When the reference clock 32 is low and the delayed clock 36 is high, the Out_Up signal 190 goes low and the ripple voltage 46 then charges with a constant current defined by the current source 52. When the delayed clock 36 is low (between edges 199 and 200), both charging and discharging is disabled, hence the ripple voltage 46 is stable and the transmission gate 195 is opened (with a high value on tg_gate 196 and a low value on tg_gate_b 197) thus shorting the ripple voltage 46 to the control voltage 94. Accordingly, the ripple voltage 46 is discharged from a rising edge 198 of the delayed clock 36 to the falling edge 199 of the reference clock 32 and charged from the falling edge 199 of the reference clock 32 to the falling edge 200 of the delayed clock 36. FIG. 14 to FIG. 17 show alternative embodiments 210, 212, 214 and 216 respectively with the embodiment 210 included in the embodiment 180 of FIG. 12. The embodiment 180 of FIG. 12 includes the embodiment 210 of FIG. 14. Accordingly tg_gate 196 may be driven by Clk_Dly_b 92 and tg_gate_b 197 may be driven by Clk_Dly 36.

FIG. 18 shows an embodiment 220 of a method for quadrature phase shifted clock generation with duty cycle correction. With reference to FIG. 3, FIG. 4 and FIG. 18, at 222 a reference clock 32 is delayed (by the delay circuit 34) to generate a delayed clock 36, the delay proportional to a control value 94. At 224, a first edge value (Vriph 72 associated with the rising edge at 112), is increased based on a first combination of states (between edges 110 and 112) of the reference clock 32 and the delayed clock 36. At 226, the first edge value is decreased based on a second combination of states (between edges 112 and 114). At 228, a second edge value (Vripl 82 associated with the falling edge at 114), is increased based on a third combination of states (between edges 114 and 116). At 230, the second edge value is decreased based on a fourth combination of states (between edges 116 and 118). At 232, the control value 94 is driven to the first edge value Vriph 72 and the second edge value Vripl 82 during second (high) and first (low) respective states of the delayed clock 36.

Figure 19:
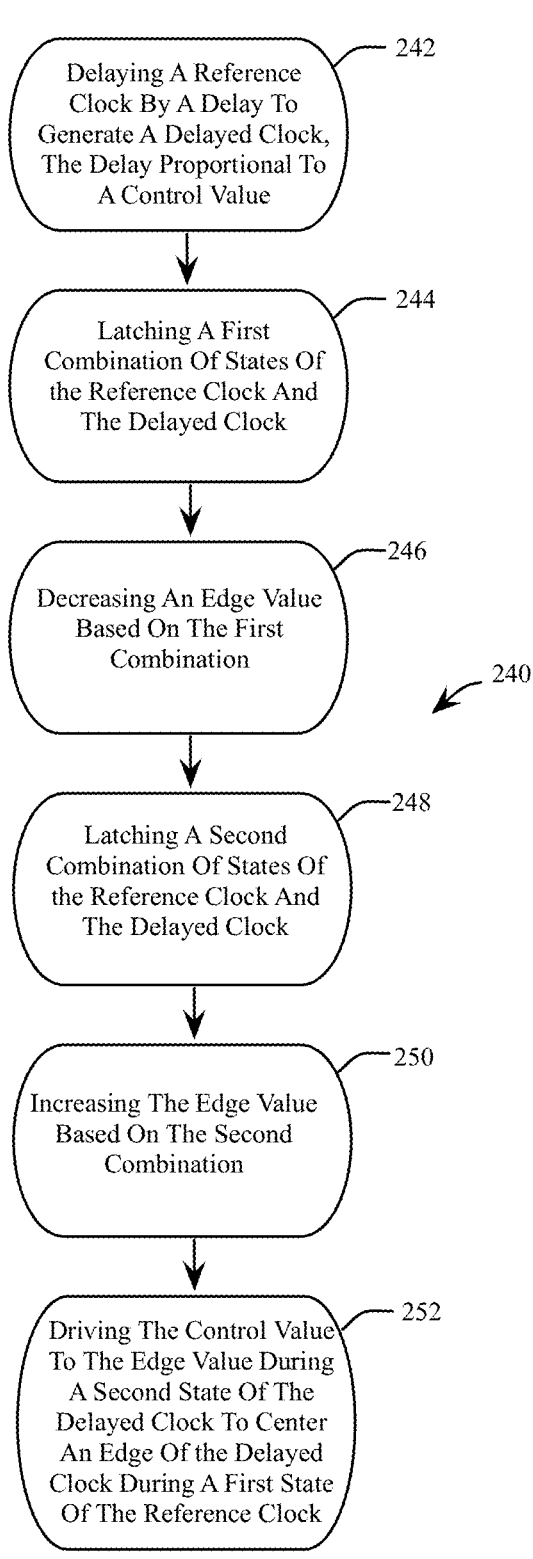
FIG. 19 is a flowchart representation of another method for quadrature phase shifted clock generation with extended input duty range, in accordance with an embodiment of the present disclosure.

FIG. 19 shows an embodiment 240 of a method for quadrature phase shifted clock generation with extended input duty range. With reference to FIG. 12, FIG. 13 and FIG. 19, at 242 a reference clock 32 is delayed by a delay to generate a delayed clock 36, where the delay is proportional to a control value 94. At 244, a first combination of states of the reference clock 32 and the delayed clock 36 is latched (with the flip-flop 182). At 246, an edge value 198 is decreased based on the first combination. At 248, a second combination of states of the reference clock 32 and the delayed clock 36 is latched (with the flip-flop 182). At 250, the edge value 198 is increased based on the second combination. At 252, the control value 94 is driven to the edge value 46 during a second state (low) state of the delayed clock 36 to center an edge 198 of the delayed clock 36 during a first state (high) of the reference clock 32.

As will be appreciated, at least some of the embodiments as disclosed include at least the following. In one embodiment, a method for quadrature phase shifted clock generation with duty cycle correction comprises delaying a reference clock with a delay circuit to generate a delayed clock, wherein a delay of the delay circuit is proportional to a control value, and each of the reference clock and the delayed clock comprise a plurality of states comprising a first state and a second state. A first edge value is increased in response to a first combination of the states of the reference clock and the delayed clock. The first edge value is decreased in response to a second combination of the states of the reference clock and the delayed clock. A second edge value is increased in response to a third combination of the states of the reference clock and the delayed clock. The second edge value is decreased in response to a fourth combination of the states of the reference clock and the delayed clock. The control value is driven to the first edge value during the second state of the delayed clock. The control value is driven to the second edge value during the first state of the delayed clock.

Alternative embodiments of the method for quadrature phase shifted clock generation with duty cycle correction include one of the following features, or any combination thereof. At least one of increasing and decreasing each of the first edge value and the second edge value is responsive to changing a respective charge on a respective capacitor of the first edge value and the second edge value. Driving the control value comprises multiplexing one of the first edge value and the second edge value, wherein the control value controls a voltage controlled current source of the delay circuit configured to modify a bias current of a cascaded plurality of inverters between the reference clock and the delayed clock. Driving the control value to the first edge value further comprises decoupling the first edge value from the control value during the first state of the reference clock and driving the control value to the second edge value further comprises decoupling the second edge value from the control value during the second state of the reference clock. The first combination of the states comprises the first state of the reference clock and the second state of the delayed clock. The second combination of the states comprises the first state of the reference clock and the first state of the delayed clock. The third combination of the states comprises the second state of the reference clock and the first state of the delayed clock. The fourth combination of the states comprises the second state of the reference clock and the second state of the delayed clock. The method for quadrature phase shifted clock generation with duty cycle correction is applied to the delayed clock to generate a second delayed clock, and to recover a radio frequency signal with a double data rate clock formed by the delayed clock and the second delayed clock.

In another embodiment, an apparatus comprises a delay circuit configured to generate a delayed clock from a reference clock, wherein a first edge of the delayed clock is delayed by a first delay in response to a first control value and a second edge of the delayed clock is delayed by a second delay in response to a second control value, and wherein each of the reference clock and the delayed clock comprise a plurality of states comprising a first state and a second state. A first control circuit is configured to determine the first control value by increasing a first voltage for a first time interval spanning a first edge of the first state of the reference clock and the first edge of the delayed clock, and decreasing the first voltage for a second time interval spanning the second edge of the first state of the reference clock and the first edge of the delayed clock. A second control circuit is configured to determine the second control value by increasing a second voltage for a third time period spanning a first edge of the second state of the reference clock and a second edge of the delayed clock and decreasing the second voltage for a fourth time period spanning a second edge of the second state of the reference clock and the second edge of the delayed clock.

Alternative embodiments of the apparatus include one of the following features, or any combination thereof. A first capacitor is configured to store a first charge alterable by at least one of increasing and decreasing the first voltage, and a second capacitor is configured to store a second charge alterable by at least one of increasing and decreasing the second voltage. A multiplexer is configured to couple the first control value to the delay circuit in response to the second state of the delayed clock, and to couple the second control value to the delay circuit in response to the first state of the delayed clock. A first transmission gate is configured to decouple the first control value from a control input to the delay circuit during the first state of the reference clock and to decouple the second control value from the control input to the delay circuit during the second state of the reference clock. The delay circuit comprises a cascaded plurality of inverters between the reference clock and the delayed clock, and at least two of the invertors comprise a bias current responsive to the first control value and the second control value. The bias current is sourced by a N-channel Field Effect Transistor and the first delay and the second delay are each inversely proportional to the control input to the delay circuit. The bias current is sourced by a P-channel Field Effect Transistor and the first delay and the second delay are each proportional to the control input to the delay circuit. The delayed clock from the apparatus is coupled to a second instance of the apparatus to generate a second delayed clock, wherein the delayed clock and the second delayed clock each are duty cycle corrected and are combined to form a double data rate clock having twice the frequency of the reference clock.

In another embodiment, a method for quadrature phase shifted clock generation with extended input duty range comprises delaying a reference clock with a delay circuit to generate a delayed clock, wherein a delay of the delay circuit is proportional to a control value, and each of the reference clock and the delayed clock comprise a plurality of states comprising a first state and a second state. A first combination of the respective states of the reference clock and the delayed clock is latched. An edge value is decreased in response to the first combination of the respective states of the reference clock and the delayed clock. A second combination of the respective states of the reference clock and the delayed clock is latched. The edge value is increased in response to the second combination of the respective states of the reference clock and the delayed clock. The control value is driven to the edge value during the second state of the delayed clock to center an edge of the delayed clock during the first state of the reference clock.

Alternative embodiments of the method for quadrature phase shifted clock generation with extended input duty range include one of the following features, or any combination thereof. The edge value is increased in response to a first signal determined by a logical OR function of a transmission gating signal and an output of a latch configured to latch the first combination and the second combination, wherein the transmission gating signal is used to couple the edge value to the control value during the second state of the delayed clock.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

We claim:

1. A method for quadrature phase shifted clock generation with duty cycle correction comprising:
   delaying a reference clock with a delay circuit to generate a delayed clock, wherein a delay of the delay circuit is proportional to a control value, and each of the reference clock and the delayed clock comprise a plurality of states comprising a first state and a second state;
   increasing a first edge value in response to a first combination of the states of the reference clock and the delayed clock;
   decreasing the first edge value in response to a second combination of the states of the reference clock and the delayed clock;
   increasing a second edge value in response to a third combination of the states of the reference clock and the delayed clock;
   decreasing the second edge value in response to a fourth combination of the states of the reference clock and the delayed clock;
   driving the control value to the first edge value during the second state of the delayed clock; and
   driving the control value to the second edge value during the first state of the delayed clock, wherein driving the control value to the first edge value further comprises decoupling the first edge value from the control value during the first state of the reference clock and driving the control value to the second edge value further comprises decoupling the second edge value from the control value during the second state of the reference clock.

2. The method of claim 1 wherein the first combination of the states comprises the first state of the reference clock and the second state of the delayed clock.

3. The method of claim 1 wherein the second combination of the states comprises the first state of the reference clock and the first state of the delayed clock.

4. The method of claim 1 wherein the third combination of the states comprises the second state of the reference clock and the first state of the delayed clock.

5. The method of claim 1 wherein the fourth combination of the states comprises the second state of the reference clock and the second state of the delayed clock.

6. A method for quadrature phase shifted clock generation with duty cycle correction comprising:
   delaying a reference clock with a delay circuit to generate a delayed clock, wherein a delay of the delay circuit is proportional to a control value, and each of the reference clock and the delayed clock comprise a plurality of states comprising a first state and a second state;
   increasing a first edge value in response to a first combination of the states of the reference clock and the delayed clock;
   decreasing the first edge value in response to a second combination of the states of the reference clock and the delayed clock;
   increasing a second edge value in response to a third combination of the states of the reference clock and the delayed clock;
   decreasing the second edge value in response to a fourth combination of the states of the reference clock and the delayed clock;
   driving the control value to the first edge value during the second state of the delayed clock; and
   driving the control value to the second edge value during the first state of the delayed clock,
   wherein at least one of increasing and decreasing each of the first edge value and the second edge value is responsive to changing a respective charge on a respective capacitor of the first edge value and the second edge value,
   wherein driving the control value comprises multiplexing one of the first edge value and the second edge value, wherein the control value controls a voltage controlled current source of the delay circuit configured to modify a bias current of a cascaded plurality of inverters between the reference clock and the delayed clock.

7. The method of claim 6 wherein the first combination of the states comprises the first state of the reference clock and the second state of the delayed clock.

8. The method of claim 6 wherein the second combination of the states comprises the first state of the reference clock and the first state of the delayed clock.

9. The method of claim 6 wherein the third combination of the states comprises the second state of the reference clock and the first state of the delayed clock.

10. The method of claim 6 wherein the fourth combination of the states comprises the second state of the reference clock and the second state of the delayed clock.

11. A method for quadrature phase shifted clock generation with duty cycle correction comprising:
   delaying a reference clock with a delay circuit to generate a delayed clock, wherein a delay of the delay circuit is proportional to a control value, and each of the reference clock and the delayed clock comprise a plurality of states comprising a first state and a second state;

increasing a first edge value in response to a first combination of the states of the reference clock and the delayed clock;

decreasing the first edge value in response to a second combination of the states of the reference clock and the delayed clock;

increasing a second edge value in response to a third combination of the states of the reference clock and the delayed clock;

decreasing the second edge value in response to a fourth combination of the states of the reference clock and the delayed clock;

driving the control value to the first edge value during the second state of the delayed clock; and driving the control value to the second edge value during the first state of the delayed clock, wherein the method for quadrature phase shifted clock generation with duty cycle correction is applied to the delayed clock to generate a second delayed clock.

12. The method of claim 11 further comprising recovering a radio frequency signal with a double data rate clock formed by the delayed clock and the second delayed clock.

13. An apparatus comprising:

a delay circuit configured to generate a delayed clock from a reference clock, wherein a first edge of the delayed clock is delayed by a first delay in response to a first control value and a second edge of the delayed clock is delayed by a second delay in response to a second control value, and wherein each of the reference clock and the delayed clock comprise a plurality of states comprising a first state and a second state;

a first control circuit configured to determine the first control value by increasing a first voltage for a first time interval spanning a first edge of the first state of the reference clock and the first edge of the delayed clock, and decreasing the first voltage for a second time interval spanning the second edge of the first state of the reference clock and the first edge of the delayed clock;

a second control circuit configured to determine the second control value by increasing a second voltage for a third time period spanning a first edge of the second state of the reference clock and a second edge of the delayed clock and decreasing the second voltage for a fourth time period spanning a second edge of the second state of the reference clock and the second edge of the delayed clock; and a multiplexer configured to couple the first control value to the delay circuit in response to the second state of the delayed clock, and to couple the second control value to the delay circuit in response to the first state of the delayed clock.

14. The apparatus of claim 13 further comprising a first capacitor configured to store a first charge alterable by at least one of increasing and decreasing the first voltage, and a second capacitor configured to store a second charge alterable by at least one of increasing and decreasing the second voltage.

15. The apparatus of claim 13 wherein the delay circuit comprises a cascaded plurality of inverters between the reference clock and the delayed clock, and at least two of the invertors comprise a bias current responsive to the first control value and the second control value.

16. The apparatus of claim 15 wherein the bias current is sourced by a N-channel Field Effect Transistor and the first delay and the second delay are each inversely proportional to the control input to the delay circuit.

17. The apparatus of claim 15 wherein the bias current is sourced by a P-channel Field Effect Transistor and the first delay and the second delay are each proportional to the control input to the delay circuit.

18. An apparatus comprising:

a delay circuit configured to generate a delayed clock from a reference clock, wherein a first edge of the delayed clock is delayed by a first delay in response to a first control value and a second edge of the delayed clock is delayed by a second delay in response to a second control value, and wherein each of the reference clock and the delayed clock comprise a plurality of states comprising a first state and a second state;

a first control circuit configured to determine the first control value by increasing a first voltage for a first time interval spanning a first edge of the first state of the reference clock and the first edge of the delayed clock, and decreasing the first voltage for a second time interval spanning the second edge of the first state of the reference clock and the first edge of the delayed clock;

a second control circuit configured to determine the second control value by increasing a second voltage for a third time period spanning a first edge of the second state of the reference clock and a second edge of the delayed clock and decreasing the second voltage for a fourth time period spanning a second edge of the second state of the reference clock and the second edge of the delayed clock; and a first transmission gate configured to decouple the first control value from a control input to the delay circuit during the first state of the reference clock and to decouple the second control value from the control input to the delay circuit during the second state of the reference clock.

19. The apparatus of claim 18 further comprising a first capacitor configured to store a first charge alterable by at least one of increasing and decreasing the first voltage, and a second capacitor configured to store a second charge alterable by at least one of increasing and decreasing the second voltage.

20. The apparatus of claim 18 wherein the delay circuit comprises a cascaded plurality of inverters between the reference clock and the delayed clock, and at least two of the invertors comprise a bias current responsive to the first control value and the second control value.

21. An apparatus comprising:

a delay circuit configured to generate a delayed clock from a reference clock, wherein a first edge of the delayed clock is delayed by a first delay in response to a first control value and a second edge of the delayed clock is delayed by a second delay in response to a second control value, and wherein each of the reference clock and the delayed clock comprise a plurality of states comprising a first state and a second state;

a first control circuit configured to determine the first control value by increasing a first voltage for a first time interval spanning a first edge of the first state of the reference clock and the first edge of the delayed clock, and decreasing the first voltage for a second time interval spanning the second edge of the first state of the reference clock and the first edge of the delayed clock; and a second control circuit configured to determine the second control value by increasing a second voltage for a third time period spanning a first edge of the second state of the reference clock and a second edge of the delayed clock and decreasing the second voltage for a fourth time period spanning a second edge of the second state of the reference clock and the second edge of the delayed clock, wherein the delayed clock from the apparatus is coupled to a second instance of the apparatus to generate a second delayed clock, wherein the delayed clock and the second delayed clock each are duty cycle corrected and are combined to form a double data rate clock having twice the frequency of the reference clock.

22. A method for quadrature phase shifted clock generation with extended input duty range comprising:

delaying a reference clock with a delay circuit to generate a delayed clock, wherein a delay of the delay circuit is proportional to a control value, and each of the reference clock and the delayed clock comprise a plurality of states comprising a first state and a second state;

latching a first combination of the respective states of the reference clock and the delayed clock;

decreasing an edge value in response to the first combination of the respective states of the reference clock and the delayed clock;

latching a second combination of the respective states of the reference clock and the delayed clock;

increasing the edge value in response to the second combination of the respective states of the reference clock and the delayed clock; and driving the control value to the edge value during the second state of the delayed clock to center an edge of the delayed clock during the first state of the reference clock, wherein the edge value is increased in response to a first signal determined by a logical OR function of a transmission gating signal and an output of a latch configured to latch the first combination and the second combination, wherein the transmission gating signal is used to couple the edge value to the control value during the second state of the delayed clock.

\* \* \* \* \*